(12) United States Patent
Schlarmann

(10) Patent No.: US 8,178,942 B2
(45) Date of Patent: May 15, 2012

(54) ELECTRICALLY ALTERABLE CIRCUIT FOR USE IN AN INTEGRATED CIRCUIT DEVICE

(75) Inventor: Mark E. Schlarmann, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 382 days.

(21) Appl. No.: 12/418,327

(22) Filed: Apr. 3, 2009

(65) Prior Publication Data
US 2010/0252908 A1  Oct. 7, 2010

(51) Int. Cl.
*H01L 23/52* (2006.01)

(52) U.S. Cl. ... 257/529; 257/48; 257/209; 257/E29.325; 257/E29.333; 324/507; 324/550; 365/96; 365/148

(58) Field of Classification Search ............ 257/48, 257/209, 529, E29.325, E29.333; 324/507, 324/550; 365/96, 148
See application file for complete search history.

(56) References Cited

U.S. PATENT DOCUMENTS

| | | | |
|---|---|---|---|
| 4,814,853 A | 3/1989 | Uchida | |
| 5,376,820 A | 12/1994 | Crafts et al. | |
| 6,335,228 B1* | 1/2002 | Fuller et al. | 438/131 |
| 7,274,049 B2* | 9/2007 | Dennison | 257/209 |
| 7,368,801 B2* | 5/2008 | Otsuka et al. | 257/529 |
| 7,911,025 B2* | 3/2011 | Hsu et al. | 257/530 |
| 2003/0209734 A1 | 11/2003 | Kothandaraman | |
| 2007/0222028 A1* | 9/2007 | Matsuoka et al. | 257/529 |
| 2008/0150076 A1 | 6/2008 | Nam et al. | |
| 2008/0277756 A1* | 11/2008 | Min et al. | 257/529 |
| 2009/0057818 A1 | 3/2009 | Kim et al. | |
| 2009/0302416 A1* | 12/2009 | Abou-Khalil et al. | 257/529 |
| 2010/0264514 A1* | 10/2010 | Iwamoto et al. | 257/529 |

OTHER PUBLICATIONS

PCT/US2010/028278 International Search Report and Written Opinion mailed Oct. 26, 2010.

* cited by examiner

*Primary Examiner* — Evan Pert
*Assistant Examiner* — Eduardo A Rodela
(74) *Attorney, Agent, or Firm* — Jackson Walker L.L.P.

(57) ABSTRACT

An electrically alterable circuit (EAC), suitable for use in an integrated circuit, includes a first interconnect, a link element, and a second interconnect. A first set of interconnect vias provides an electrically conductive connection between the first interconnect and a first end of the link element; A second set of interconnect vias provides an electrically conductive connection between the second interconnect and a second end of the link element. The EAC further includes a third interconnect and a one or more fuse vias that provide an electrical connection between the third interconnect and the link element. A conductance of the one or more fuse vias is less than a conductance of the first set of interconnect vias, a conductance of the second set of interconnect vias, or both.

14 Claims, 4 Drawing Sheets

ELECTRICALLY ALTERABLE CIRCUIT FOR USE IN AN INTEGRATED CIRCUIT DEVICE

BACKGROUND

1. Field

The disclosed subject matter is in the field of integrated circuits and, more specifically, integrated circuits employing links or other electrically programmable elements.

2. Related Art

In some integrated circuit devices, fuses, links, and other alterable elements may be used to implement configurable functionality, redundant or spare device elements, and for various other reasons. Fuses and links may be implemented as relatively thin and usually straight and short structures of a conductive or semi-conductive material. When the fuses are intact, they may provide an electrically conductive path between two other elements of the integrated circuit. When the fuses are "blown," the electrically conductive path is ideally altered to an opened circuit. Fuses and links may be "blown" or otherwise altered using, for example, laser technology, electrical currents, or other means. Regardless of the materials and programming techniques used, fuses and links may not always blow in a consistent manner that results in a stable or reliable open circuit condition.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
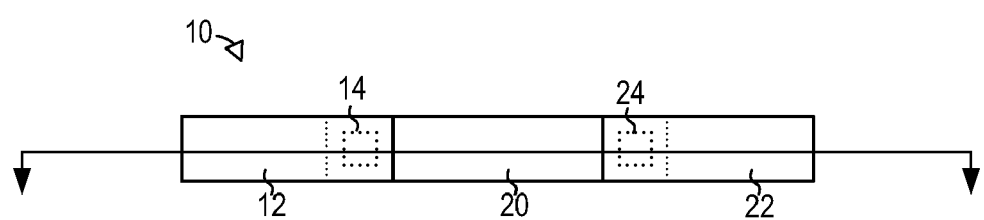
FIG. 1 is a top view of an embodiment of a fuse link.

In one aspect, a disclosed integrated circuit includes a link element overlying a substrate and a first interlevel dielectric layer (ILD) overlying the first link element. A first interconnect layer overlies the first ILD. The first interconnect layer includes a first interconnect and a second interconnect. A first set of one or more interconnect vias, formed in the first ILD, connects the first interconnect to the link element. A second set of one or more interconnect vias, formed in the first ILD, connects the second interconnect to the link element.

In one embodiment, a second ILD overlies the first interconnect layer and a third interconnect overlies the second ILD. A fuse via, through the second ILD and the first ILD, connects the third interconnect to the link element. In an alternative embodiment, the third interconnect is included in the first interconnect layer. In this embodiment, the fuse via is formed through first ILD and connects the third interconnect to the link element.

The first interconnect, the second interconnect, and the third interconnect may be made of a first material and the link element may be made of a second material that is different than the first material. The first material, for example, may be a metal and the second material may be polysilicon or another type of semiconductor.

The first set of one or more interconnect vias connect a first end of the link element to the first interconnect and the second set of one or more interconnect vias connect a second end of the link to the second interconnect. The set of one or more fuse vias may include just a single fuse via. In these embodiments, the single fuse via may connect the third interconnect to a portion of the link element located intermediate between the first end and the second end of the link element. The single fuse via might, for example, connect an end of the third interconnect to a midpoint of the link element.

In another aspect, a disclosed electrically alterable circuit, suitable for use in an integrated circuit, includes a first interconnect, a link element, and a second interconnect. A first set of one or more interconnect vias provides an electrically conductive connection between the first interconnect and a first end of the link element. A second set of one or more interconnect vias provides an electrically conductive connection between the second interconnect and a second end of the link element.

The electrically alterable circuit further includes a third interconnect and a set of one or more fuse vias that provide an electrical connection between the third interconnect and the link element. A conductance of the set of one or more fuse vias may be less than a conductance of the first set of one or more interconnect vias, a conductance of the second set of one or more interconnect vias, or both.

A material for the first, second, and third interconnects may include aluminum, copper, or another suitable metal. The link element may be polysilicon or another material that differs from the material of the interconnects. In embodiment where the fuse via(s) and the interconnect via(s) occur in different ILDs, the fuse via(s) and the interconnect via(s) may be of the same material or different materials. A suitable material for the fuse vias and/or the interconnect vias includes tungsten or another suitable metal. The first and second sets of vias may each include multiple vias and the set of one or more fuse vias may consist of a single fuse via.

In still another aspect, a disclosed method of altering an integrated circuit includes connecting a first terminal of a power source, e.g., a ground terminal of a voltage source, to a first interconnect, a second interconnect, or both. The first and second interconnects are connected to a link element by respective sets of one or more interconnect vias. A second terminal of the power source, e.g., a VDD terminal of a voltage source, may be connected to a third interconnect where the third interconnect may be connected to the link element by a fuse via.

The power source may then generate a forced voltage or forced current power state that may be maintained for a duration sufficient to alter an electrical characteristic of the fuse via, e.g., cause an open circuit. After altering the electrical characteristic of the fuse via, a flow of current may be created between the first and second interconnects through the link element. A value of an electrical characteristic of the link element is measured and used to verify the integrity of the fuse via alteration based upon the value of the electrical characteristic. The multiple vias between the link elements and the first and second interconnects may contact the link element distal from, i.e., at different ends of, the link element midpoint while the fuse via may contact the link element proximal to the midpoint.

Figure 2:
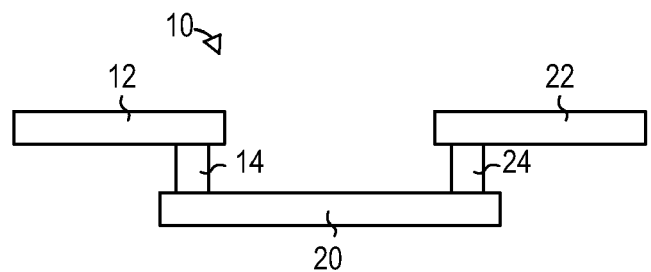
FIG. 2 is a sectional view of the fuse link of FIG. 1.

Turning to the drawings, FIG. 1 depicts a top view of a programmable fuse 10 and FIG. 2 depicts a sectional view of programmable fuse 10 taken along the section line indicated in FIG. 1. Programmable fuse 10 may be used, for example, in nonvolatile memory devices or other integrated circuit devices. The depicted embodiment of programmable fuse 10 includes a first interconnect 12 connected to a link 20 through a first via 14 and a second interconnect 22 connected to link 20 through a second via 24. In some embodiments, first interconnect 12 and second interconnect 22 are aluminum, link 20 is polycrystalline silicon, and first and second vias 14 and 24 are tungsten. One of ordinary skill in the field of semiconductor fabrication processes will appreciate that any interlevel dielectrics have been omitted from the illustration of FIG. 2 for the sake of clarity.

Programming of programmable fuse 10 may be achieved by causing a large DC current to pass through the programmable fuse. If the magnitude of the current is sufficient, rapid local heating occurs due to the polysilicon resistivity of link 20. If the current is maintained for a sufficient duration, polysilicon in link 20 and tungsten in the vias may react to form a silicide at the interface between link 20 and at least one of the tungsten vias 14 and 24. If the silicide formation consumes sufficient tungsten in via 14 or 24, an open circuit in programmable fuse 10 may result.

If a process shift or other type of change occurs, programmable fuse 10 may program in an undesired manner. For example, polysilicon link 20 may fail before either of the tungsten vias 14 and 24 is consumed by the silicide formation. A programmable fuse 10 in this condition may pose a long term reliability issue if, for example, the polysilicon link 20 subsequently recovers conductivity. Because improperly programmed fuses pose a reliability concern, it may be necessary to devote time and resources to configuring test systems and cross-sectioning fuses to proper programming.

Figure 3:
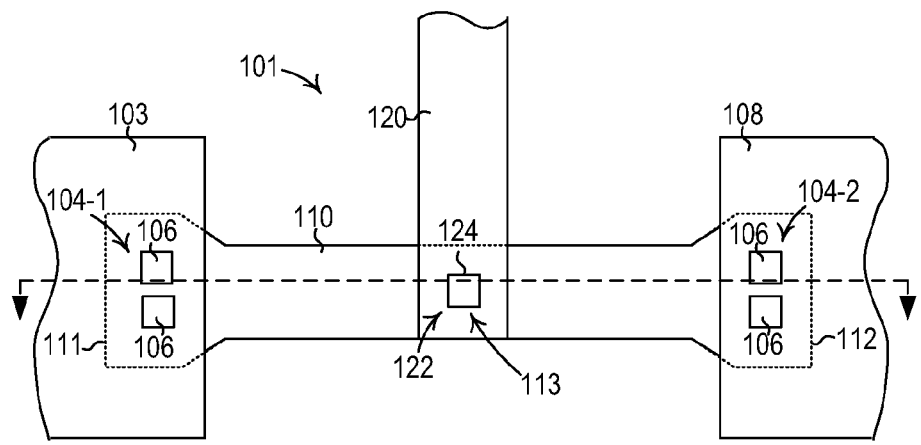
FIG. 3 is a top view of a portion of an embodiment of an electrically alterable circuit.
Figure 4:
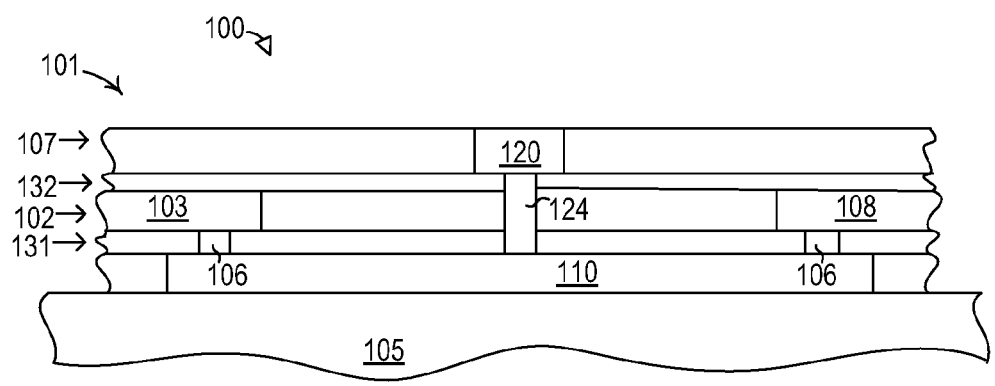
FIG. 4 is a sectional view of the circuit of FIG. 3.

Turning now to FIG. 3 and FIG. 4, a top view and a corresponding sectional view illustrate selected elements of an embodiment of an electrically alterable circuit (EAC) 101. EAC 101 as shown is a component of an integrated circuit 100. Aspects of integrated circuit 100 not included in EAC 101 are omitted from the drawings for the sake of clarity. Integrated circuit 100 may, however, represent any of a wide variety of integrated circuit devices including, as examples, volatile and nonvolatile memory, general purpose and application specific processors, and so forth.

In the embodiment depicted in FIG. 3 and FIG. 4, EAC 101 includes a link element 110 overlying a substrate 105. A first ILD 131 overlies link element 110 and a first interconnect layer 102 overlies first ILD 131. First interconnect layer 102 as shown includes a first interconnect 103 and a second interconnect 108. A second ILD 132 overlies first interconnect layer 102 and second interconnect layer 107 overlies second ILD 132. Second interconnect layer 107 as shown includes a third interconnect 120.

First interconnect 103 is connected to link element 110 through a first set 104-1 of one or more interconnect vias 106. Second interconnect 108 is shown as connected to link element 110 through a second set 104-2 of one or more interconnect vias 106. Third interconnect 120 is connected to link element 110 through a set 122 of one or more fuse vias 124. In the embodiment depicted in FIG. 3, the first set 104-1 and second set 104-2 of interconnect vias 106 include multiple interconnect vias 106 and the set 122 of fuse vias 124 includes just a single fuse via 124. Other embodiments may employ multiple fuse vias 124 in set 122 and more or fewer interconnect vias 106 in sets 104-1 and 104-2.

In the depicted embodiment, interconnect vias 106 and fuse via 124 have approximately the same cross sectional area. In these embodiments, the cumulative cross sectional area of a set of vias is proportional to the number of vias in the set. The cross sectional area of a set of vias influences the density of current that flows through the vias under any given current/voltage state. For a given current/voltage state, a larger cumulative cross sectional area results in a lower current density. The current density is an important parameter in the alteration of EAC 101.

In other embodiments, fuse via(s) 124 may have a different cross sectional area than the interconnect vias 106. In these embodiments, the number of vias in any given set of vias may be less significant than the cumulative cross sectional area of the vias in the set. For example, although FIG. 3 depicts two interconnect vias 106 in first set 104-1 and second set 104-2, other embodiments may employ a single interconnect via 106 having a cross sectional area approximately twice as large as the cross sectional area of the interconnect vias 106 as shown. In other embodiments, regardless of the respective cross sectional areas of the vias, the conductance of the set of fuse vias 124 is less than either the conductance of the first set 104-1 or the second set 104-2 of interconnect vias 106.

In the depicted embodiment, the set 122 of one or more fuse vias 124 includes just a single fuse via 124 and the first set 104-1 and second set 104-2 of interconnect vias 106 each include multiple vias. Whether through the number of vias in a set, the cumulative cross sectional area of the vias in a set, or both, EAC 101 may be configured such that, when a current flows, for example, from third interconnect 120 to first interconnect 103 and second interconnect 108, the current density in fuse via(s) 124 is greater than the current density in interconnect vias 106. In this manner, it is highly probable that fuse via(s) 124 will be the first element(s) of EAC 101 altered when a sufficiently high current is applied to the circuit.

In some embodiments, interconnect vias 106 contact link element 110 distal from a midpoint 113 of link element 110. In the depicted embodiment, for example, the first set 104-1 of one or more interconnect vias 106 contacts link element 110 proximal to a first end 111 of link element 110 and contacts first interconnect 103. Similarly, the second set 104-2 of one or more interconnects contacts link element 110 proximately to a second end 112 of link element 110 and contact second interconnect 108. The set 122 of one or more fuse vias 124 contacts link element 110 approximately at its midpoint 113. In some embodiments that employ a single fuse via 124, the fuse via 124 contacts link element 110 proximal to a midpoint 113 of link element 110. In these embodiments, EAC 101 has a symmetrical configuration in which approximately half of any current flowing from third interconnect 120 to first and second interconnects 103 and 108, will flow through the first set 104-1 of one or more interconnect vias 106 and approximately half will flow through the second set 104-2 of one or more interconnect vias 106.

In depicted embodiment, first interconnect 103 and second interconnect 108 are part of first interconnect layer 102, i.e., first interconnect 103 and second interconnect 108 are deposited, patterned, and etched simultaneously. In other embodiments, first interconnect 103 and second interconnect 108 may be formed during distinct processing steps.

In the embodiment depicted in FIG. 4, link element 110 overlies substrate 105. Substrate 105 may include a bulk substrate material such as silicon, another semiconductor element or semiconductor compound, a dielectric or other electrically insulating material, or a combination thereof. For example, substrate 105 may include a silicon-on-insulator (SOI) structure in which an active semiconductor layer, e.g., a layer in which transistors and other devices and structures may be formed, overlies a buried oxide layer that overlies a silicon bulk. In non-SOI embodiments, substrate 105 may include a bulk semiconductor or semiconductor compound, the upper portions of which may be utilized to form transistors and other devices. Substrate 105 may also include some or all "front end" structures of integrated circuit 100. Front end structures might include transistors, diodes, capacitors, resistors, and other devices. Moreover, substrate 105 might further include backend structures such as one or more interconnect layers and corresponding ILDs formed prior to link element 110.

Although the materials used for EAC 101 are an implementation detail, some embodiments of EAC 101 employ polysilicon for link element 110 and aluminum, copper, or another metal or metal compound for first interconnect 103, second interconnect 108, and/or third interconnect 120. Although polysilicon is a suitable candidate for link element 110, other conductive or semi-conductive materials may be used. Polysilicon may be a desirable candidate for link element 110 in processes that include a backend polysilicon layer for other structures, e.g., processes that include two or more polysilicon layers. If polysilicon is used for link element 110 in a process that does not otherwise include a backend polysilicon layer, formation of link element 110 might undesirably increase the number of processing steps including the number of lithography steps.

In some embodiments, the first interconnect layer 102 may use one type of metal and the second interconnect layer 107 may use another. In other embodiments, the materials used for first interconnect layer 102 and second interconnect layer 107 are the same or substantially the same. In some embodiments, the interconnect vias 106 are or include tungsten or another suitable metal.

Figure 5:
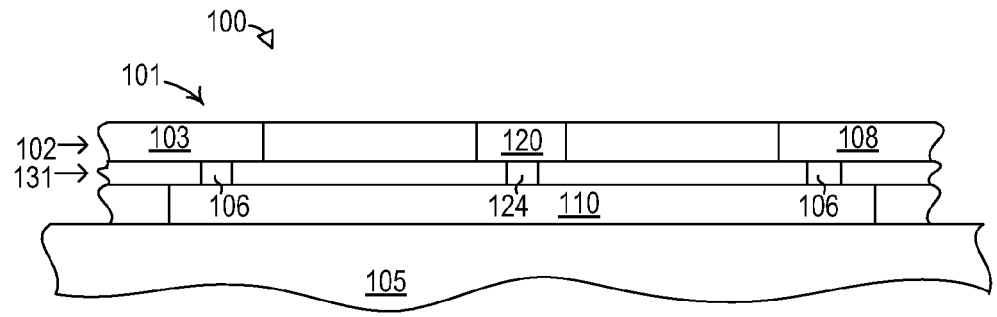
FIG. 5 is a sectional view of an alternative implementation of the circuit of FIG. 3.

Referring now to FIG. 5, a partial cross sectional view of an alternative embodiment of EAC 101 is depicted. In the embodiment depicted in FIG. 5, third interconnect 120 is part of the first interconnect layer 102. In this embodiment, first interconnect layer 102 overlies first ILD 131 and interconnect vias 106 and the one or more fuse via(s) 124 formed in the first ILD 131. While the embodiment depicted in FIG. 4 beneficially provides greater ability to differentiate between materials used for third interconnect 120 and the interconnects in first interconnect layer 102, differentiate between materials used and sizing of vias formed in the first ILD 131 and the second ILD 132, and route the third interconnect 120 without regard to the routing of first and second interconnects 103 and 108, the embodiment depicted in FIG. 5 and FIG. 6 beneficially achieves the EAC 101 in potentially fewer processing steps including fewer photolithography steps.

Figure 6:
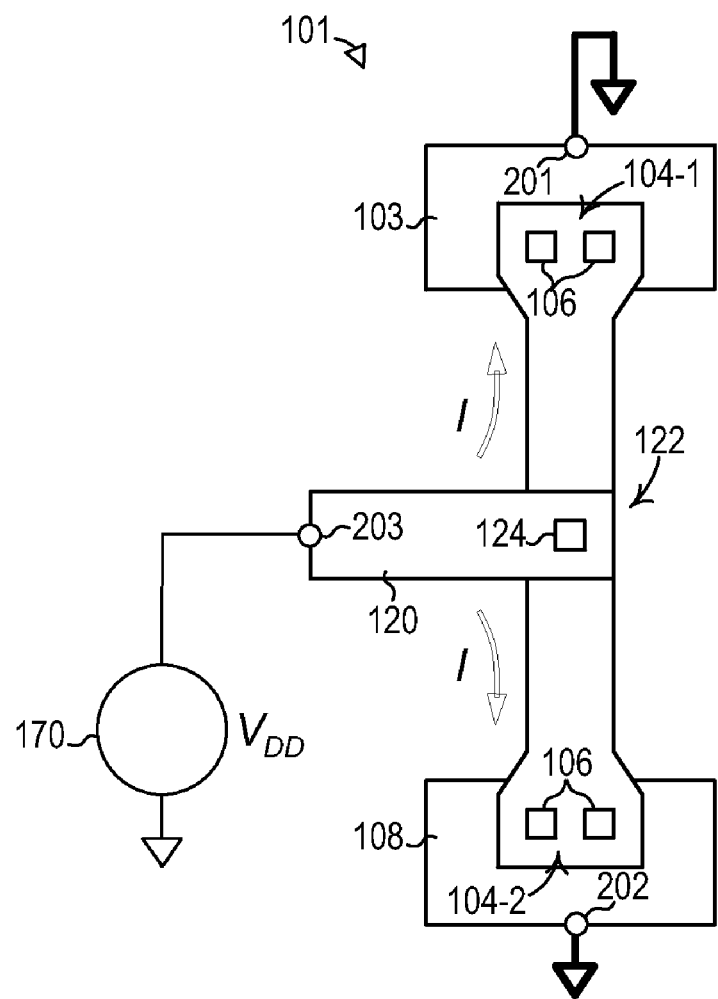
FIG. 6 illustrates a configuration for electrically altering the circuit of FIG. 3.

Referring now to FIG. 6, one embodiment of EAC 101 is depicted in a programming configuration. In the programming configuration as depicted, a power source 170 is connected to the three terminals of EAC 101, namely, first terminal 201 associated with first interconnect 103, second terminal 202 associated with second interconnect 108, and third terminal 203 associated with third interconnect 120. Power source 170 may be a voltage source, a current source, or a combination thereof, e.g., a power source that forces voltage until the resulting current achieves a threshold value, at which point the power source may force current. Other embodiments may force current until a specified voltage is achieved and thereafter force voltage.

In the implementation depicted in FIG. 6, power source 170 is a voltage source operable to produce a supply voltage, VDD. To alter EAC 101 electrically, also sometimes referred to as programming EAC 101, the supply voltage VDD generated by power source 170 is applied to third interconnect 120 while first terminal 201 and second terminal 202 are grounded. In other configurations, VDD may be connected to first and second terminal 201 and 202 while third terminal 203 is grounded. In the depicted configuration, a current, IDD, flows through third interconnect 120 and fuse via 124 to link element 110. The symmetry of EAC 101 as depicted in FIG. 3, FIG. 4, or FIG. 6 results in approximately half of the current, i.e., IDD/2, flowing through the first set 104-1 of one or more interconnect vias 106 and approximately the same amount of current flowing through the second set 104-2 of one or more interconnect vias 106. In the depicted configuration, in which first set 104-1 and second set 104-2 each includes two interconnect vias 106, the set 122 includes a single fuse via 124, and the cross sectional areas of interconnect vias 106 is approximately equal to the cross section areas of fuse via 124, the current through any interconnect via 106 is approximately 25% of the IDD current that flows through fuse via 124.

Although FIG. 6 depicts a power source 170 as a voltage source, other embodiments of programming EAC 101 may employ current sources as power source 170. In either case, power source 170 generates a power state that is applied to the three terminals of EAC 101. The power state, whether it is a forced voltage or a forced current, causes the supply current to flow through the set 122 of one or more fuse vias 124 and a fraction of the supply current to flow through the interconnect vias 106. By maintaining a power state that generates sufficient supply current for a sufficient duration, the resulting alteration or programming of EAC 101 includes an increased fuse via impedance. In some implementations, the power state is maintained until the one or more fuse vias 124 become open circuits or have an impedance in excess of a specified threshold, e.g., 1 MΩ.

Figure 7:
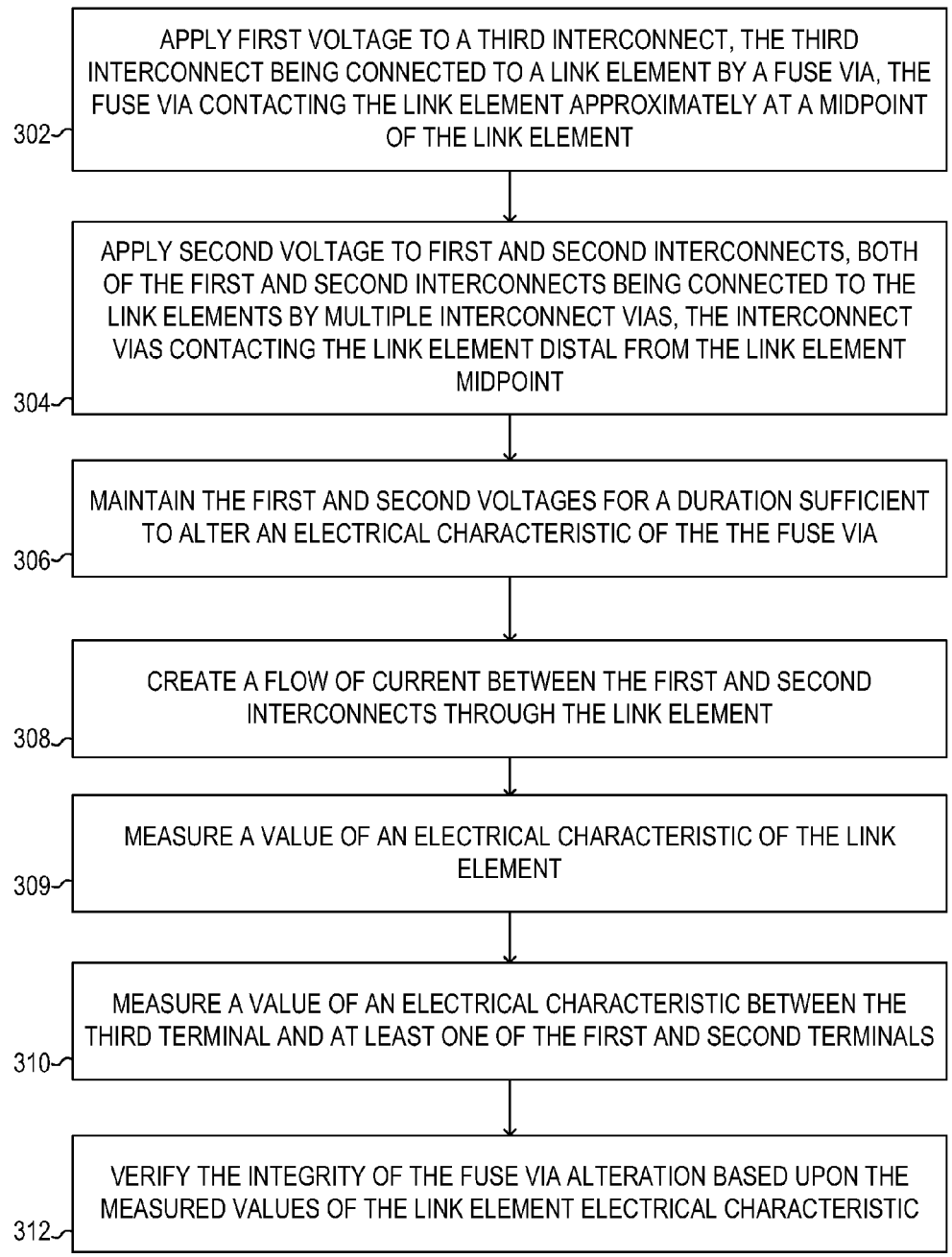
FIG. 7 is a flow diagram of an embodiment of a method of electrically altering a circuit.

FIG. 7 depicts a flow diagram of selected elements of an embodiment of a method 300 for programming EAC 101 in which a power state is generated by a power source and applied to the EAC. The power state causes a current to flow through the fuse via and alter the electrical characteristics of the fuse via, e.g., by creating an open circuit or a highly resistive circuit. After the alteration of the fuse via occurs, the programming operation may be characterized or verified electrically, e.g., by measuring a resistivity of the link element 110 via the first and second interconnects. The measured value may be used as a proxy for the integrity of the programming operation based, for example, on historical data correlating resistivity or another electrically measurable parameter to long term stability or reliability.

In the embodiment depicted in FIG. 7, method 300 includes applying (operation 302) a first voltage, e.g., VDD, from a power source 170 to an interconnect of EAC 101, e.g., third interconnect 120, where the third interconnect 120 is connected to a link element, e.g., link element 110, by a set of one or more fuse vias, e.g., set 122. A second voltage, e.g., ground, from power source 170 is applied (operation 304) to one or more interconnects, e.g., first interconnect 103, second interconnect 108, or both, wherein the first and second interconnects are connected to the link element by respective sets of one or more interconnect vias.

Method 300 as depicted further includes maintaining (operation 306) the power state for a duration sufficient to alter an electrical characteristic of the fuse via. After altering the electrical characteristic of the fuse via, method 300 as shown includes creating (operation 308) a flow of current between first and second interconnects through the link element and measuring (operation 309) a value of an electrical characteristic of the link element. In the embodiment depicted in FIG. 7, method 300 may further include measuring (operation 310) an electrical characteristic, e.g. impedance, between the third terminal 203 and at least one of the first and second terminals 201 and 202 to verify that the fuse link 124 was properly altered, e.g., open circuited during the programming operation. The integrity of the programming operation may then be verified (block 312) based on the measured value of the electrical characteristic of the link element and/or the measure value of the impedance or other parameter between the third interconnect and the first and second interconnects. In some embodiments, the electrical characteristic might be the resistance, impedance, or resistivity of the link element and verifying the integrity of the programming operation might mean determining that the value of the electrical characteristic lies within a predetermined range. For example, if the measured resistivity of the link element is too high, one may conclude that the programming caused an undesired open circuit in the link element. Similarly, if the impedance between the third interconnect and the first or second interconnects below a specified threshold, that might indicate that the programming was insufficient, either in current, duration, or both, to open circuit the fuse via. Regardless of the implementation details of the verification operation, method 300 encompasses the electrical verification of the programming operation using the EAC itself. This feature beneficially enables a technique for testing the programming operation that is less costly, time consuming, and destructive than cross sectioning or other similar techniques.

Although the invention is described herein with reference to specific embodiments, various modifications and changes can be made without departing from the scope of the present invention as set forth in the claims below. For example, although the depicted embodiment of EAC 101 is illustrated with a specific layout, e.g., with the first and second interconnects being collinear with the link element 110 and third interconnect 120 laid out perpendicular to link element 110, other embodiments may employ different layouts. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a link element formed overlying a substrate;
   a first interlevel dielectric layer (ILD) overlying the link element;
   a first interconnect layer overlying the first ILD, the first interconnect layer including a first interconnect and a second interconnect;
   a first plurality of interconnect vias, formed in the first ILD, contacting the first interconnect to the link element;
   a second plurality of interconnect vias, formed in the first ILD, contacting the second interconnect to the link element;
   a third interconnect wherein the third interconnect is included in a second interconnect layer overlying a second ILD overlying the first interconnect layer; and
   a fuse via connecting the third interconnect to the link element.

2. The integrated circuit of claim 1, wherein the first interconnect, the second interconnect, and the third interconnect comprise a first material and the link element comprises a second material, wherein the second material is different than the first material.

3. The integrated circuit of claim 2, wherein the first material is a metal and wherein the second material is polysilicon.

4. The integrated circuit of claim 1, wherein the first plurality of interconnect vias connects a first end of the link element to an end of the first interconnect and wherein the second plurality of interconnect vias connects a second end of the link element to an end of the second interconnect.

5. The integrated circuit of claim 4, wherein the fuse via is the only via connecting the third interconnect and the link element.

6. The integrated circuit of claim 5, wherein the fuse via connects an end of the third interconnect to a point that is approximately a midpoint of the link element.

7. An electrically alterable circuit (EAC) suitable for use in an integrated circuit, the EAC comprising:
   a first interconnect;
   a link element;
   a first set of one or more interconnect vias providing an electrically conductive connection between the first interconnect and a first end of the link element;
   a second interconnect;
   a second set of one or more interconnect vias providing an electrically conductive connection between the second interconnect and a second end of the link element;
   a third interconnect; and
   a set of one or more fuse vias, the set of fuse vias providing an electrical connection between the third interconnect and the link element;
   wherein a conductance of the set of one or more fuse vias is less than a conductance of the first set of one or more interconnect vias;
   wherein the set of one or more fuse vias include vias of a first material; and
   wherein the first set of one or more interconnect vias and the second set of one or more interconnect vias include vias of a second material, wherein the first material and the second material are different.

8. The electrically alterable circuit of claim 7, wherein a composite cross sectional area of the set of one or more fuse vias is less than a composite cross sectional area of the second set of one or more interconnect vias.

9. The electrically alterable circuit of claim 7, wherein a material for the first interconnect and the second interconnect includes aluminum.

10. The electrically alterable circuit of claim 9, wherein a material of the link element comprises polycrystalline silicon.

11. The electrically alterable circuit of claim 7, wherein the first material comprises tungsten.

12. The electrically alterable circuit of claim 7, wherein the first set of one or more interconnect vias and the second set of one or more interconnect vias include vias of the first material.

13. The electrically alterable circuit of claim 7, wherein one of the first and the second material comprises tungsten.

14. The electrically alterable circuit of claim 7, wherein at least one of the first set of one or more interconnect vias and the second set of one or more interconnect vias includes multiple vias and further wherein the set of one or more fuse vias consists of a single fuse via.

* * * * *